(12) United States Patent
Wang et al.

(10) Patent No.: US 6,649,284 B2
(45) Date of Patent: Nov. 18, 2003

(54) ELECTROLUMINANCE DEVICE

(75) Inventors: Yi-Fan Wang, Tainan Hsien (TW); Wen-Kuo Weng, Taipei Hsien (TW); Po-Yen Lu, Taoyuan Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 59 days.

(21) Appl. No.: 09/863,361

(22) Filed: May 24, 2001

(65) Prior Publication Data

US 2002/0192497 A1 Dec. 19, 2002

(51) Int. Cl.⁷ .............................. H05B 33/14
(52) U.S. Cl. .................. 428/690; 428/917; 313/504; 313/506
(58) Field of Search .................. 428/690, 917; 313/504, 506

(56) References Cited

U.S. PATENT DOCUMENTS

| 5,935,721 A | 8/1999 | Shi et al. |
| 5,972,247 A | 10/1999 | Shi et al. |
| 2002/0028346 A1 * | 3/2002 | Shi et al. ..................... 428/690 |

FOREIGN PATENT DOCUMENTS

| EP | 1 009 044 A2 * | 6/2000 |
| JP | 06299148 A * | 10/1994 |
| TW | 86101551 | 2/1986 |

OTHER PUBLICATIONS

"Influence of the Chemical Structure on the Luminescence Properties of Organic Dye Molecules" Materials Research Society Symposium Proiceedings, 598 (Electrical, Optical, and Magnetic Properties of Organic Solid–State Materials V), BB3.72/1–BB3.72/6, 2000.*

* cited by examiner

*Primary Examiner*—Cynthia H. Kelly
*Assistant Examiner*—Dawn L. Garrett
(74) *Attorney, Agent, or Firm*—Birch, Stewart, Kolasch & Birch, LLP

(57) ABSTRACT

An organic EL device includes an anode, a cathode and an EL element arranged between the two. The EL element includes a substance represented by the following chemical formula:

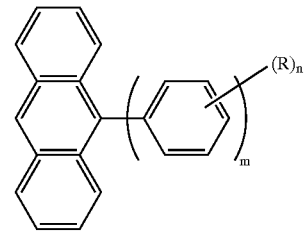

in which m, n=1–3; the substitute R is selected from a group consisting of t-butyl, phenyl, methylphenyl, naphehyl and heterocyclic compound. The EL element is highly efficient, lower-voltage operative and easy to be synthesized.

5 Claims, 6 Drawing Sheets

ELECTROLUMINANCE DEVICE

BACKGROUND OF THE INVENTION

1. Field of Invention

The present invention generally relates to an organic electroluminescence device, and more particularly relates to an organic blue luminescence material applicable to an electroluminescence device. The material is highly efficient, lower-voltage operative and easy to be synthesized.

2. Related Art

Figure 1:
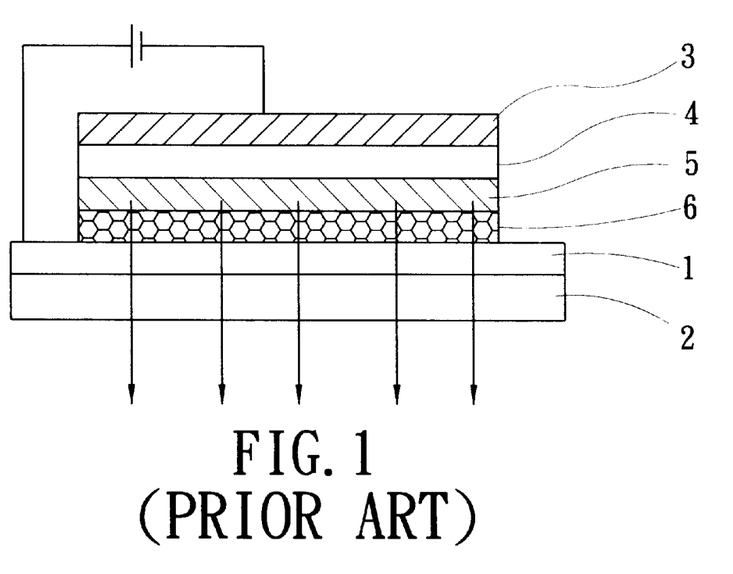
FIG. 1 is a sectional view of a basic organic EL device.

The first efficient green organic electroluminescence (EL) device developed by Eastman Kodak Company in 1987 started to arouse people's attentions. The basic construction of an organic electroluminescence device is shown in FIG. 1. There are thin organic films or called electroluminescence element arranged between a cathode 3 and a anode 1. Electric current passing through the EL element makes electrons combining with electric holes at the EL element and emitting light.

Figure 2:
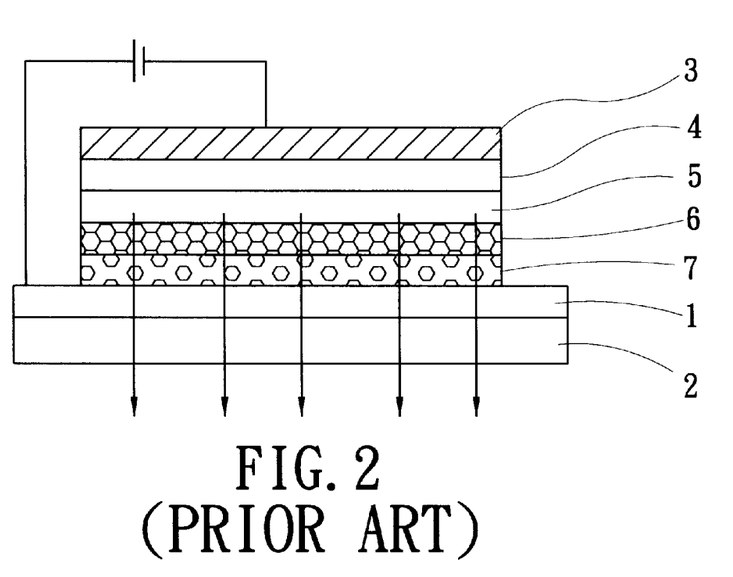
FIG. 2 is a sectional view of another organic EL device.

The two-layer structure of an organic electroluminescence device of FIG. 1 has a two-layer organic electroluminescence element. A hole-transport layer 6 is deposited on a transparent anode 1 (which is an indium-tin-oxide (ITO) conductive film formed on a glass substrate 2). A light emitting layer 5 and an electron-transport layer are further deposited on the hole-transport layer 6. The light emitting layer 5 and the electron-transport layer 4 are capable of transporting electrons and emitting. A metal cathode 3 is finally deposited on the electron-transport layer 4. The cathode 3 mainly includes metallic elements of magnesium, lithium and aluminum. A multi-layer structure is shown in FIG. 2. There are other organic layers deposited between the transparent anode 1 and the metal cathode 3. They are hole-injection layer HIL 7, hole-transport layer HTL 6, light emitting layer EML 5 and electron-transport layer ETL (or electron-injection layer EIL) 4, etc. These layers will increase the injection efficiency of carriers (electrons and holes), decrease the operating voltage and increase the carrier recombination probability.

EL devices have advantages of high luminance, self-emission, low driving voltage, no limitation of view angle and easy fabrication. Therefore, they are applicable to planar displays. But, there are still some difficulties, for example, lower efficiency of emission, limited luminance, and limited durability. Influencing factors for these problems mainly include:

1) The efficiency of carrier injection. Since the EL device is a light emitter having two carrier injections that electrons and holes are injected from the cathode and the anode to the organic layers where recombination occurs, energy released and light emitted, the capability or efficiency of the electrode injections will highly influence the luminance and efficiency of the light emission. Therefore, some new materials for injection layers, such as the material for hole injection layer, disclosed in Taiwan Patent Application No. 8610155 1, are developed for increasing the efficiency of injection.

2) The impurities in the EL elements. When the carriers recombining in the EL element and emitting the energy, the impurities will transform a part of energy into heat, and decrease the efficiency and luminance of light emission. The heat accumulation also causes recrystallization of the organic element, and even causes heat decomposition and influence the durability of the element.

Figure 3A:
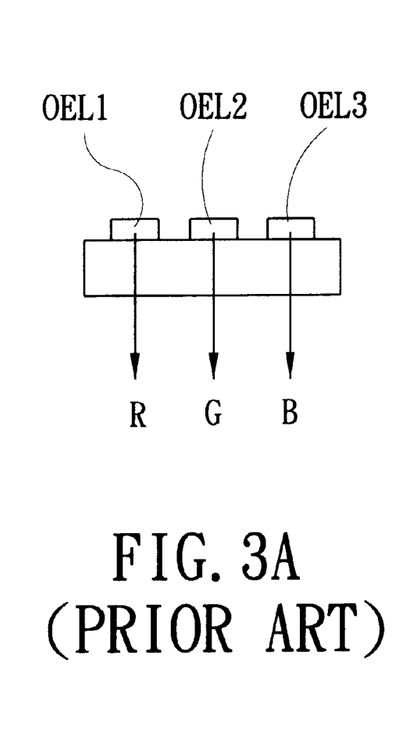
FIGS. 3A–3C are sectional views of three types of color organic EL devices wherein R represents red, G represents green and B represents blue.
Figure 3B:
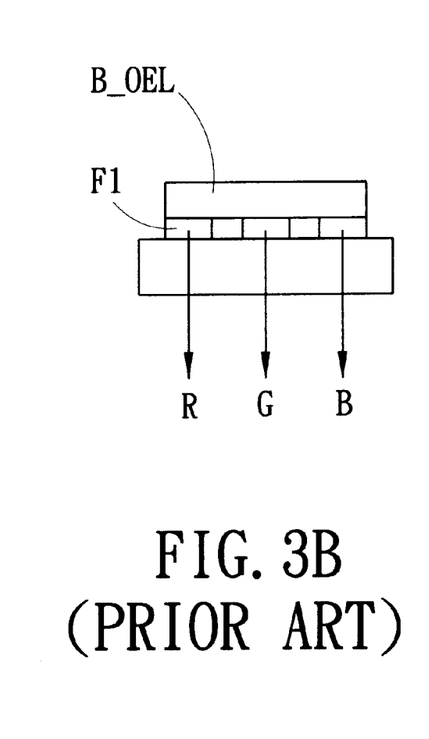
Figure 3C:
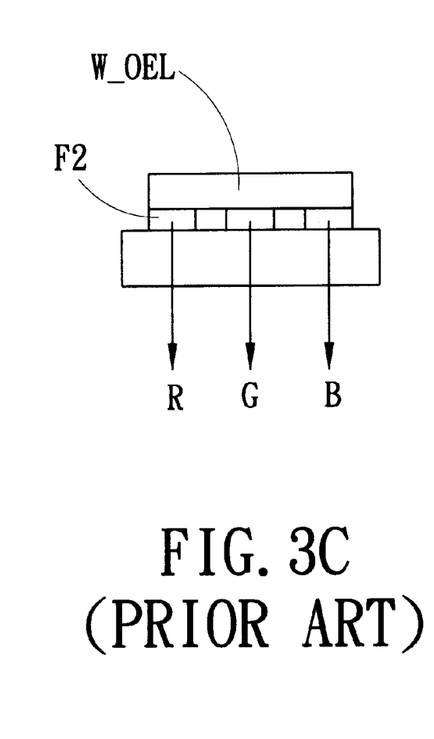

In the recent display using organic light emitting diodes (OLED), single color, multiple-color or full color types are developed. The construction of a full color OLED display can be one of the following three types, as shown in FIGS. 3A to 3C:

1) Three color independent emitters. For each pixel, three EL members OEL1, OEL2 and OEL3 for generating red, green and blue lights are arranged so as to compose the desired color of light.
2) Blue light transformers. Providing a blue EL member (B_OEL) for a blue light source.
   Preparing light transforming films F1 for transforming the blue light into red and green lights. The blue EL member here is a full area member without the need of making pixels.
3) White light color filters. A white EL member (W-OEL) provides white back-light for LCD color filters F2 to provide full colors.

The former two types have been more quickly developed and products are marketed. When using blue light transformers, a high efficiency blue EL is needed, But generally, the common blue EL device has lower efficiency and requires higher operating voltage. The composition of blue organic EL element is also complicated, with lower yield and higher cost. Known blue EL elements include 9, 10-di-(2-naphthyl)anthracene derivatives as disclosed in U.S. Pat. No. 5,935,721, and 9, 10-bis(3', 5'-diaryl) phenylanthracene derivatives as disclosed in U.S. Pat. No. 5,972,247. But, the two prior blue EL elements are not quite satisfied.

SUMMARY OF THE INVENTION

It is therefore an object of the present invention to provide a blue EL element with high efficiency of emission, low operatng voltage, and easy to be synthesized.

A blue EL element with high efficiency of emission and low driving voltage according to the present invention is an adjusted construction of 9, 10-(diphenyl)anthracene). An asymmetric construction is made, and a steric-hindrance substitute group is added in order to prevent the element from recrystallization.

The EL element according to the present invention is made of a substance represented by the following chemical formula:

in which m, n=1–3; the substitute R is selected from the group consisting of t-butyl, phenyl, methylphenyl, naphehyl and heterocyclic compound.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

FIGS. 1–3 are illustrations of prior arts and described above.

Figure 4:
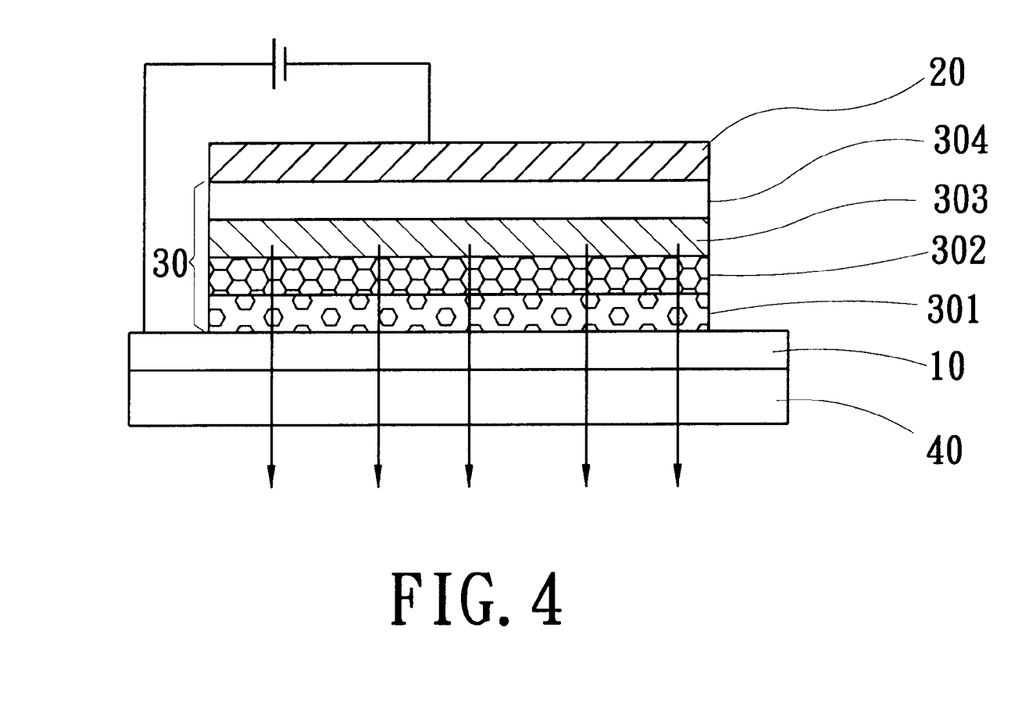
FIG. 4 a sectional view of EL device of the present invention.

As shown in FIG. 4, an organic EL device according to the present invention includes an anode 10, a cathode 20 and an EL element 30 arranged between the two. The anode 10 is an ITO conductive film formed on a substrate 40 of glass or transparent plastic. The cathode 20 includes metallic elements of magnesium, lithium and aluminum. The EL element 30 includes a hole-injection layer 301, a hole-transport layer 302, a light emitting layer 303 and an electron-transport layer 304. The light emitting layer (EML) 303 is substantially made of 9, 10-(diphenyl)anthracene, which is a high efficiency blue fluorescence material, but originally subject to recrystallization during fabrication process. The present invention adjusts the construction of 9, 10-(diphenyl)anthracene into an asymmetric construction, and adds a steric-hindrance substitute group for preventing the element from recrystallization. So that an EL element made of a new high efficiency blue fluorescence material is obtained. The light emitting layer 303 according to the present invention is made of a substance represented by the following chemical formula:

in which m, n=1–3; the substitute R is selected from the group consisting of t-butyl, phenyl, methylphenyl, naphehyl and heterocyclic compound.

In a second embodiment of the present invention, the light emitting layer 303 is made of a substance represented by the following chemical formula:

in which m, n=1–3; the substitute R is selected from the group consisting of methyl, isopropyl, t-butyl, phenyl, naphehyl and heterocyclic compound.

Examples of synthesis of the blue EL elements according to the present invention will be described below.

SYNTHESIS EXAMPLE 1

Compound A: 9-(4'-t-Butylbiphenyl)Anthracene a) Synthesizing 4-Tert-4'-Biphenylmagnesiumbromide 6.6 grams of 4-bromo-biphenyl and 1 gram of magnesium were mixed with 20 ml tetraphdrofurane in a 150 ml reaction bottle, heated under 80° C. and stirred for 4 hours for reaction;

b) 5 grams of 9-bromo anthracene and 0.13 gram of NiCl2(dppp) were mixed with 50 ml tetraphdrofurane in a 250 ml reaction bottle, heated for reaction under 60° C. for 1 hour. Then added slowly with solution of a), stirred for reaction for 8 hours. The solvents were removed via a rotary evaporator. The residue was washed with 100 ml methanol three times and filtered. After recrytallization from toluene and methanol, 5.0 gram light yellow colored 4-tert-4'-Biphenylmagnesiumbromide was collected. Yield 68%. The structural formula is as follows.

SYNTHESIS EXAMPLE 2

Compound B: 9-4-(2,4,6-Trimethylphenyl)-1-Phenyl)Anthracene a) Synthesizing 4-1,3,5-Trimethylphenyl-1-Benzenemagnesiumbromide 7.8 grams of 4-1,3,5-trimethylphenyl-1-benzylbromide and 1 gram of magnesium were mixed with 20 ml tetraphdrofurane in a 150 ml reaction bottle, heated under 80° C. and stirred for 4 hours for reaction;

b) 5 grams of 9-bromo anthracene and 0.13 gram of NiCl2(dppp) were mixed with 50 ml tetraphdrofurane in a 250 ml reaction bottle, heated for reaction under 60° C. for 1 hour. Then added slowly with solution of a), stirred for reaction for 8 hours. The solvents were removed via a rotary evaporator. The residue was washed with 100 ml methanol three times and filtered. After recrytallization from toluene and methanol, 4.2 gram light yellow colored 9-4-(2,4,6-Trimethylphenyl)-1-phenyl)anthracene was collected. Yield 60%. The structural formula is as follows.

SYNTHESIS EXAMPLE 3

Compound C: 9-(1-(3,5-Diphenyl)Phenyl) Anthracene a) Synthesizing (3,5-Diphenylbenzylmagnesium Bromide 8.8 grams of 3,5-diphenylbenzylbromide and 1.1 gram of magnesium were mixed with 20 ml tetraphdrofurane in a 150 ml reaction bottle, stirred for 4 hours for reaction;

b) 5 grams of 9-Dirromo anthracene and 0.13 gram of NiCl2(dppp) were mixed with 50 ml tetraphdrofurane in a 250 ml reaction bottle, heated for reaction under 60° C. for 1 hour. Then added slowly with solution of a), stirred for reaction for 8 hours. The solvents were removed via a rotary evaporator. The residue was washed with 100 ml methanol three times and filtered. After recrytallization from toluene and methanol, 4.8 gram light yellow colored 9-(1-(3,5-diphenyl)phenyl)anthracene was collected. Yield 63%. The structural formula is as follows.

SYNTHESIS EXAMPLE 4

Compound D: 9-(4-t-Butylphenyl)Anthracene a) Synthesizing 4-t-Butylbenzylmagnesium Bromide 6.1 grams of (4-t-butylbenzylbromide and 1.1 gram of magnesium were mixed with 20 ml tetraphdrofurane in a 150 ml reaction bottle, stirred for 4 hours for reaction;

b) 5 grams of 9-Dibromo anthracene and 0.13 gram of NiCl2(dppp) were mixed with 50 ml tetraphdrofurane in a 250 ml reaction bottle, heated for reaction under 60° C. for 1 hour. Then added slowly with solution of a), stirred for reaction for 8 hours. The solvents were removed via a rotary evaporator. The residue was washed with 100 ml methanol three times and filtered. After recrytallization from toluene and methanol, 4.1 gram light yellow colored 9-(4-t-butylphenyl)anthracene was collected. Yield 75%. The structural formula is as follows.

PRIOR ART SYNTHESIS EXAMPLE 1

Compound E: Conventional 9-(Biphenyl) Anthracene a) Synthesizing 4-Biphenylmagnesiumbromide 6.6 grams of 4-bromo-biphenyl and 1 gram of magnesium were mixed with 20 ml tetraphdrofurane in a 150 ml reaction bottle, heated under 80° C. and stirred for 4 hours for reaction;

b) 5 grams of 9-bromo anthracene and 0.13 gram of NiCl2(dpp) were mixed with 50 ml tetraphdrofurane in a 250 ml reaction bottle, heated for reaction under 60° C. for 1 hour. Then added slowly with solution of a), stirred for reaction for 8 hours. The solvents were removed via a rotary evaporator. The residue was washed with 100 ml methanol three times and filtered. After recrytallization from toluene and methanol, 4.3 grams light yellow colored 4-biphenylmagnesiumbromide was collected. Yield 68%. The structural formula is as follows.

PRIOR ART SYNTHESIS EXAMPLE 2

Compound F: Conventional 9,10-di-(3-Methylphenyl)anthracene a) Synthesizing 3-Methylphenylmagnesiumbromide 6.4 grams of 3-methylphenylbromide and 1 gram of magnesium were mixed with 20 ml tetraphdrofurane in a 150 ml reaction bottle, heated under 80° C. and stirred for 4 hours for reaction;

b) 5 grams of 9,10-dibromo anthracene and 0.13 gram of NiCl2(dppp) were mixed with 50 ml tetraphdrofurane in a 250 ml reaction bottle, heated for reaction under 60° C. for 1 hour. Then added slowly with solution of a), stirred for reaction for 8 hours. The solvents were removed via a rotary evaporator. The residue was washed with 100 ml methanol three times and filtered. After recrytallization from toluene and methanol, 3.8 gram light yellow colored 9,10-di-(3-methylphenyl)anthracene was collected. Yield 71%. The structural formula is as follows.

Examples of fabricating EL device using aforesaid EL compounds will be described below. Each EL device includes an EL element having a hole-injection layer, a hole-transport layer, a light-emitting layer and an electron-transport layer.

FABRICATION EXAMPLE 1

Figure 5:
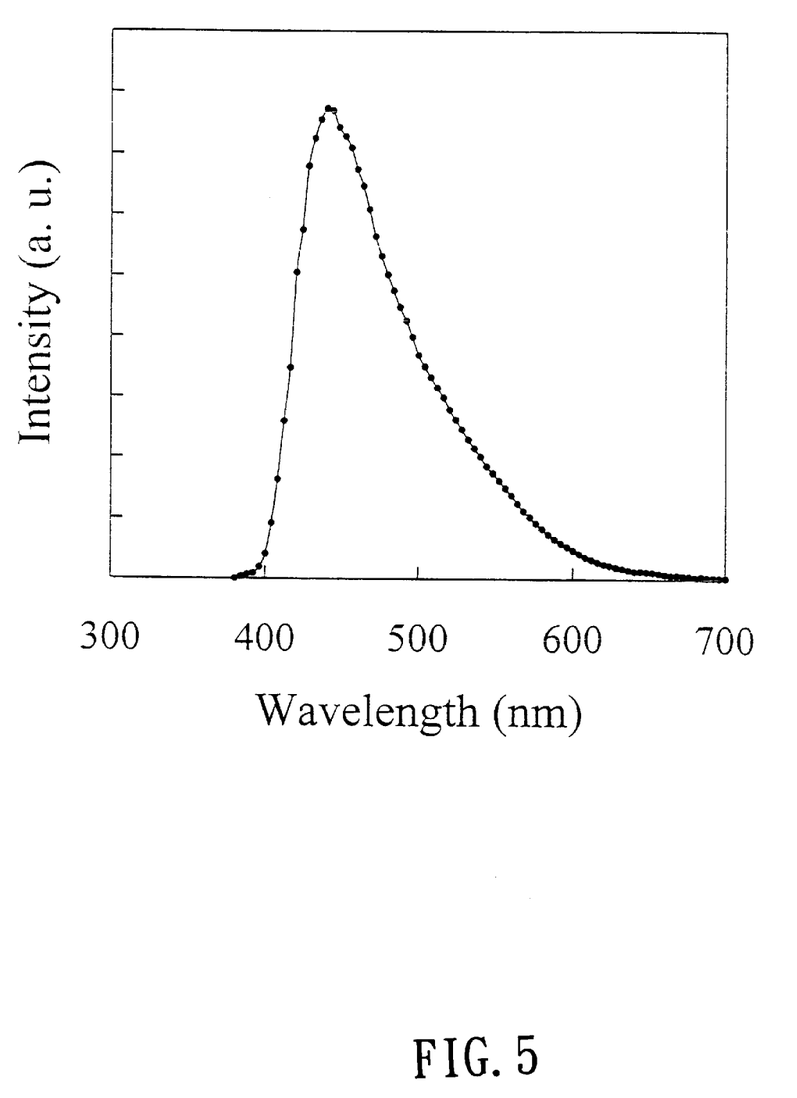
FIG. 5 is a graph showing the distribution of emission spectra regarding an EL device of the present invention.
Figure 6:
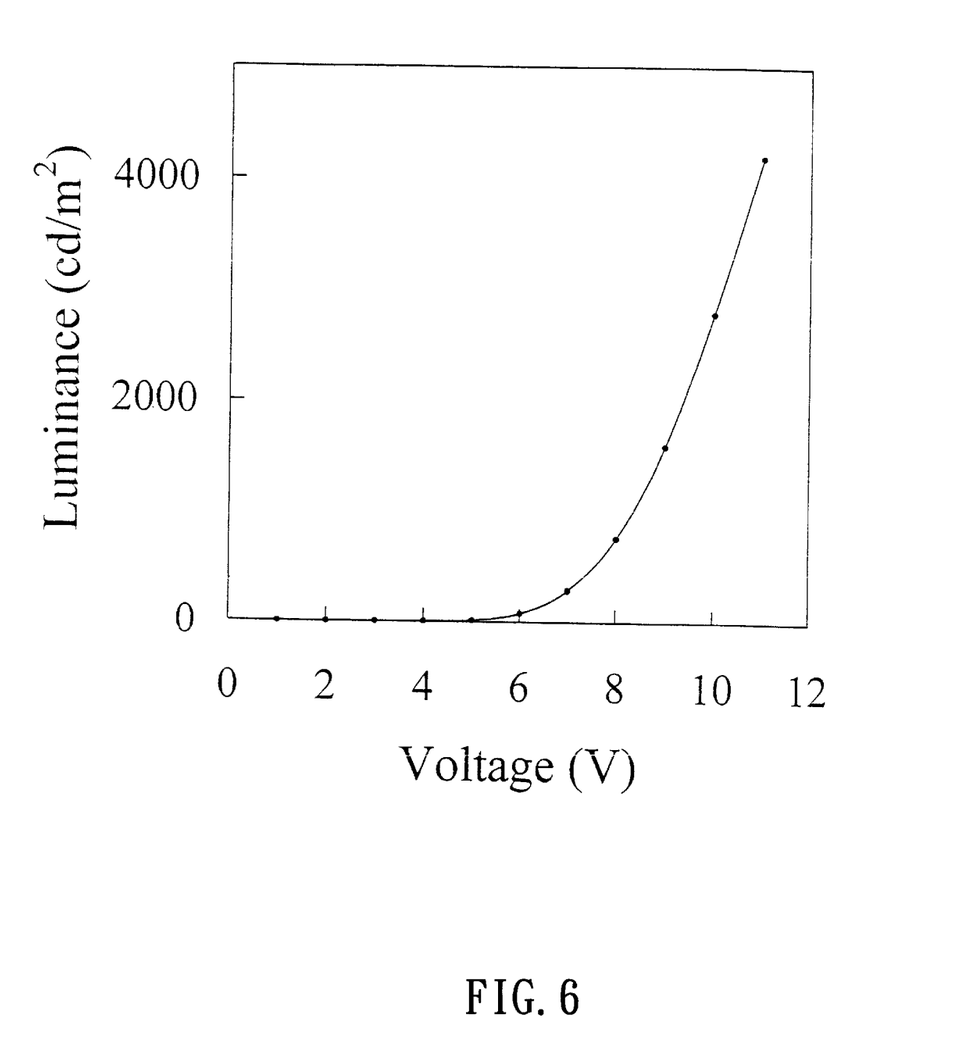
FIG. 6 is a graph representing the emission vs. voltage characteristics of an EL device of the present invention.
Figure 7:
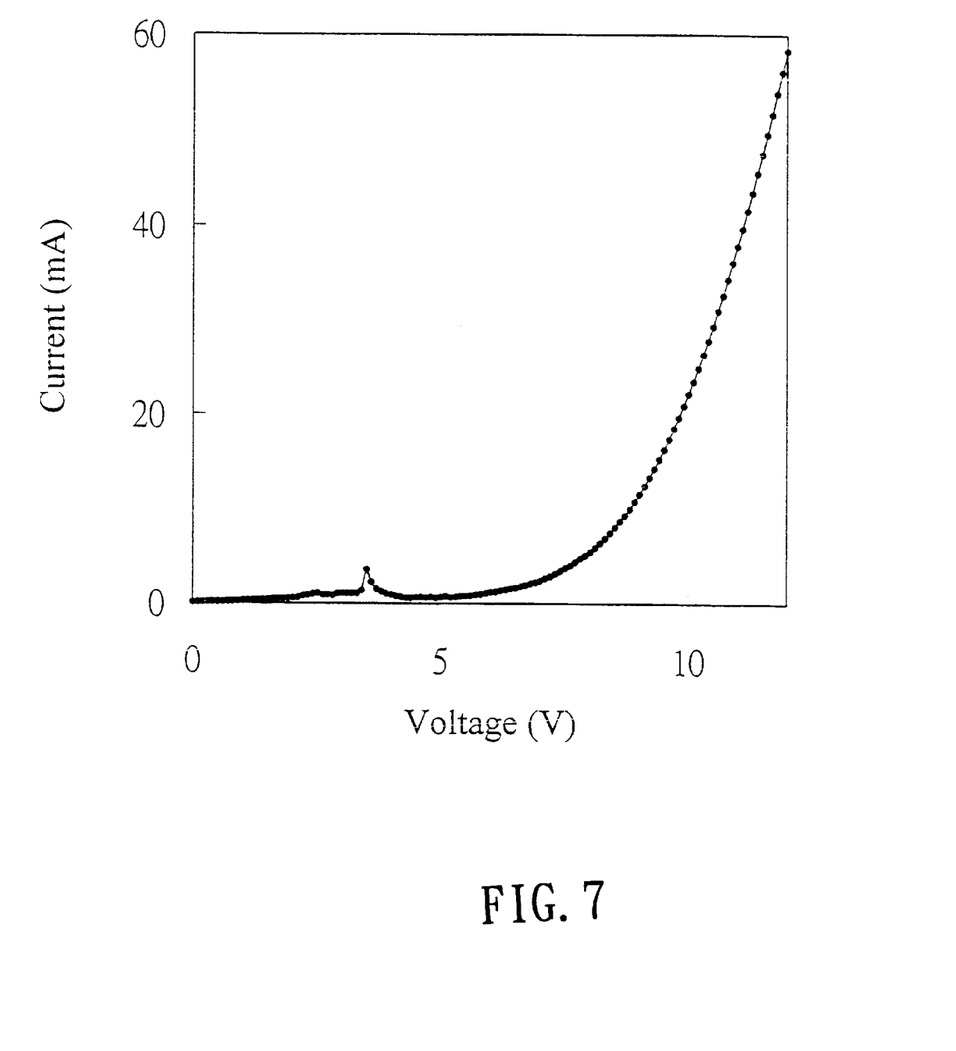
FIG. 7 is a graph representing the current vs. voltage characteristics of an EL device of the present invention.

An EL device satisfying the requirements of the invention was constructed in the following manner:

a) An indium-tin-oxide (ITO) coated glass substrate was sequentially cleaned with a commercial detergent, rinsed in deionized water and dried.

b) A hole injection layer of copper phthalocyanine (150 Angstroms), was then deposited on top of the ITO coated substrate by evaporation.

c) Onto the copper phthalocyanine layer was deposited a hole transport layer of N,N'-bis-(1-naphthyl)-N,N'-diphenylbenzidine (600 Angstroms), also by evaporation.
d) A light emitting layer of aforesaid compound A (9-(4'-t-butylbiphenyl)anthracene, 150 Angstroms) was then deposited onto the hole-transport layer.
e) An electron-transport layer of aluminum-tris-8-hydroxyquinoline (350 Angstroms) was then deposited onto the light emitting layer.
f) On top of the electron-transport layer was deposited a cathode formed of an alloy of Mg and Ag.
g) The EL device was then hermetically packaged in a dry glove box filled with nitrogen for protection against ambient environment;

The EL spectrum of this EL device has a peak emission at 440 nm with CIE color coordinates of X=Y=0.17. (The EL, I-V, B-V are shown in FIG. 5). It shows that the EL light very approaches a blue light of 450 nm. The characteristic curve for emission vs. voltage of this EL device is shown in FIG. 6. While, the characteristic curve for current vs. voltage is shown in FIG. 7.

FABRICATION EXAMPLE 2

Another EL device satisfying the requirements of the invention was constructed in the following manner:
a) An indium-tin-oxide (ITO) coated glass substrate was sequentially cleaned with a commercial detergent, rinsed in deionized water and dried.
b) A hole injection layer of copper phthalocyanine (150 Angstroms), was then deposited on top of the ITO coated substrate by evaporation.
c) Onto the copper phthalocyanine layer was deposited a hole transport layer of N,N'-bis-(1-naphthyl)-N,N'-diphenylbenzidine (400 Angstroms), also by evaporation.
d) A light emitting layer of aforesaid compound B (9-4-(2,4,6-Trimethylphenyl)-1-phenyl)anthracene, 150 Angstroms) was then deposited onto the hole-transport layer.
e) An electron-transport layer of aluminum-tris-8-hydroxyquinoline (300 Angstroms) was then deposited onto the light emitting layer.
f) On top of the electron-transport layer was deposited a cathode formed of an alloy of Mg and Ag.
g) The EL device was then hermetically packaged in a dry glove box filled with nitrogen.

FABRICATION EXAMPLE 3

Further another EL device satisfying the requirements of the invention was constructed in the following manner:
a) An indium-tin-oxide (ITO) coated glass substrate was sequentially cleaned with a commercial detergent, rinsed in deionized water and dried.
b) A hole injection layer of copper phthalocyanine (150 Angstroms), was then deposited on top of the ITO coated substrate by evaporation.
c) Onto the copper phthalocyanine layer was deposited a hole transport layer of N,N'-bis-(1-naphthyl)-N,N'-diphenylbenzidine (600 Angstroms), also by evaporation.
d) A light emitting layer of aforesaid compound C (9-(1-(3,5-diphenyl)phenyl)anthracene, 150 Angstroms) was then deposited onto the hole-transport layer.
e) An electron-transport layer of aluminum-tris-8-hydroxyquinoline (350 Angstroms) was then deposited onto the light emitting layer.
f) On top of the electron-transport layer was deposited a cathode formed of an alloy of Mg and Ag.
g) The EL device was then hermetically packaged in a dry glove box filled with nitrogen.

FABRICATION EXAMPLE 4

Again, another EL device satisfying the requirements of the invention was constructed in the following manner:
a) An indium-tin-oxide (ITO) coated glass substrate was sequentially cleaned with a commercial detergent, rinsed in deionized water and dried.
b) A hole injection layer of copper plithalocyanine (120 Angstroms), was then deposited on top of the ITO coated substrate by evaporation.
c) Onto the copper phthalocyanine layer was deposited a hole transport layer of N,N'-bis-(1-naphthyl)-N,N'-diphenylbenzidine (400 Angstroms), also by evaporation.
d) A light emitting layer of aforesaid compound D (9-(4-t-butylphenyl)anthracene, 150 Angstroms) was then deposited onto the hole-transport layer.
e) An electron-transport layer of aluminum-tris-8-hydroxyquinoline (350 Angstroms) was then deposited onto the light emitting layer.
f) On top of the electron-transport layer was deposited a cathode formed of an alloy of Mg and Ag.
g) The EL device was then hermetically packaged in a dry glove box filled with nitrogen.

COMPARATIVE FABRICATION EXAMPLE 1

An EL device using aforesaid conventional EL compound E was constructed in the following manner:
a) An indium-tin-oxide (ITO) coated glass substrate was sequentially cleaned with a commercial detergent, rinsed in deionized water and dried.
b) A hole injection layer of copper phthalocyanine (150 Angstroms), was then deposited on top of the ITO coated substrate by evaporation.
c) Onto the copper phthalocyanine layer was deposited a hole transport layer of N,N'-bis-(1-naphthyl)-N,N'-diphenylbenzidine (400 Angstroms), also by evaporation.
d) A light emitting layer of aforesaid compound E (9-(biphenyl)anthracene, 150 Angstroms) was then deposited onto the hole-transport layer.
e) An electron-transport layer of aluminum-tris-8-hydroxyquinoline (300 Angstroms) was then deposited onto the light emitting layer.
f) On top of the electron-transport layer was deposited a cathode formed of an alloy of Mg and Ag.
g) The EL device was then hermetically packaged in a dry glove box filled with nitrogen for protection against ambient environment.

COMPARATIVE FABRICATION EXAMPLE 2

An EL device using aforesaid conventional EL compound F was constructed in the following manner:
a) An indium-tin-oxide (ITO) coated glass substrate was sequentially cleaned with a commercial detergent, rinsed in deionized water and dried.
b) A hole injection layer of copper phthalocyanine (150 Angstroms), was then deposited on top of the ITO coated substrate by evaporation.

c) Onto the copper phthalocyanine layer was deposited a hole transport layer of N,N'-bis-(1-naphthyl)-N,N'-diphenylbenzidine (400 Angstroms), also by evaporation.

d) A light emitting layer of aforesaid compound F (9,10-di-(3-methylphenyl)anthracene, 150 Angstroms) was then deposited onto the hole-transport layer.

e) An electron-transport layer of aluminum-tris-8-hydroxy-quinoline (300 Angstroms) was then deposited onto the light emitting layer.

f) On top of the electron-transport layer was deposited a cathode formed of an alloy of Mg and Ag.

g) The EL device was then hermetically packaged in a dry glove box filled with nitrogen.

Finally, Tests were performed to compare the efficiencies and peak emissions of the fabricated EL devices of this invention and conventional compounds. The results are listed below that showing better performance of the present invention.

|  | Operating Voltage (V) | Efficiency (lm/W)* | Max. Wavelength (nm) |
| --- | --- | --- | --- |
| This invention | | | |
| Compound A | 7 | 1.3 | 440 |
| Compound B | 7 | 1.2 | 460 |
| Compound C | 8 | 1.3 | 450 |
| Compound D | 10 | 1.1 | 460 |
| Conventional compound | | | |
| Compound E | 12 | 0.9 | 460 |
| Compound F | 15 | 0.4 | 480 |

*Testing area: 0.25 cm$^2$

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An organic EL device comprising an anode, a cathode and an EL element arranged between the two, said EL element comprising a substance represented by the following chemical formula:

in which m, n=1–3; the substituent R is t-butyl;

and wherein said substance represented by the chemical formula above is used in the light emitting layer of the EL element.

2. An organic EL device comprising an anode, a cathode and an EL element arranged between the two, said EL element comprising a substance represented by the following chemical formula:

in which m, n=1–3; the substituent R is at least one selected from the group consisting of methyl, isopropyl, t-butyl, phenyl, naphthyl, and heterocyclyl; and wherein said substance represented by the chemical formula above is used in the light emitting layer of the EL element.

3. An organic EL device according to claim 2 wherein said substituent R is t-butyl.

4. An organic EL device according to claim 2 wherein m, n=1–3; said substituent R is at least one selected from the group consisting of t-butyl, phenyl, methylphenyl, naphthyl, and heterocyclyl.

5. An organic EL device according to claim 4 wherein said substituent R is t-butyl.

* * * * *